US005578519A

United States Patent [19]

Cho

[11] Patent Number: 5,578,519

[45] Date of Patent: Nov. 26, 1996

[54] METHOD FOR FORMING ALIGN KEY PATTERN IN SEMICONDUCTOR DEVICE

[75] Inventor: Yun-hee Cho, Seoul, Rep. of Korea

[73] Assignee: Samsung Electronics Co., Ltd., Suwon, Rep. of Korea

[21] Appl. No.: 561,824

[22] Filed: Nov. 27, 1995

[30] Foreign Application Priority Data

Jun. 23, 1995 [KR] Rep. of Korea ........................ 95-17158

[51] Int. Cl.[6] ........................................ H01L 21/762

[52] U.S. Cl. ........................................ 437/67; 437/924

[58] Field of Search ........................ 437/67, 70, 924; 148/DIG. 50, DIG. 102

[56] References Cited

U.S. PATENT DOCUMENTS

| | | | |
|---|---|---|---|
| 5,310,691 | 5/1994 | Suda | 437/67 |
| 5,316,966 | 5/1994 | Van Der Plas et al. | 437/924 |
| 5,385,861 | 1/1995 | Bashir et al. | 437/924 |
| 5,470,782 | 11/1995 | Schwalke et al. | 437/67 |

*Primary Examiner*—Chandra Chaudhari
*Attorney, Agent, or Firm*—Cushman Darby & Cushman, L.L.P.

[57] ABSTRACT

A method for forming an align key pattern in a semiconductor device is provided. The method has the steps of forming a first insulating film pattern for defining field regions in a cell array area and an align key pattern area on a semiconductor substrate, forming trenches in the field regions, using the first insulating film pattern as a mask, forming a second insulating film on the whole surface of the semiconductor substrate, filling the trenches, etching the second insulating film formed on the active regions of the cell array area and on the active and field regions of the align key pattern area, to a predetermined thickness, etching back the whole surface of the semiconductor substrate, forming a conductive layer on the whole surface of the semiconductor substrate, and covering a photoresist on the whole surface of the conductive layer. According to the present invention, an align key pattern needed for a photolithography process is obtainable by forming steps in an align key pattern area in a semiconductor device having an STI structure.

4 Claims, 5 Drawing Sheets

(ALIGN KEY PATTERN AREA)

(CELL ARRAY AREA)

(ALIGN KEY PATTERN AREA)

(CELL ARRAY AREA)

(ALIGN KEY PATTERN AREA)

(CELL ARRAY AREA)

(ALIGN KEY PATTERN AREA)

(CELL ARRAY AREA)

(ALIGN KEY PATTERN AREA)

(CELL ARRAY AREA)

(ALIGN KEY PATTERN AREA)

(CELL ARRAY AREA)

(ALIGN KEY PATTERN AREA)

METHOD FOR FORMING ALIGN KEY PATTERN IN SEMICONDUCTOR DEVICE

BACKGROUND OF THE INVENTION

The present invention relates to a method for forming an align key pattern in a semiconductor device and, more particularly, to a method for forming an align key pattern in a relatively wide align key pattern area on a semiconductor substrate.

As the level of integration in semiconductor devices has increased, device sizes have become smaller. Along with the trend, device isolation structures for electrical isolation between adjacent devices have also become smaller. Device isolation structures using a widely-used local oxidation of silicon (LOCOS) method currently reach the limits of their effectiveness, and thus they are difficult to adopt for applications to more highly integrated semiconductor devices. Accordingly, new alternatives are required to overcome the limitations of the LOCOS structures for device isolation and achieve device isolation structures needed for high integration. One of the alternatives is shallow trench isolation (STI) structures.

For STI structures, trenches are formed into a semiconductor substrate. Thereafter, the trenches are filled with an insulating material, like an oxide film, to a thickness sufficient to bury the trenches. Subsequently, the insulating materials etched back by a chemical mechanical polishing (CMP) method until the surface of an adjacent active region is exposed, thereby planarizing the whole surface of the semiconductor substrate having the trenches formed thereon. Thus, the device isolation structure is completed. The STI method is free of bird's beaks and has an advantage over the LOCOS structures with respect to minimization of isolation spacing. It possesses, however, a distinct drawback that an align key pattern necessary for subsequent photolithography steps is not obtained, since no step is created on the surface of the semiconductor substrate in the STI structure. Conventionally, when a laser is projected from an aligner of a stepper and reflected on an align key pattern formed on the semiconductor substrate, an interference pattern formed due to the irregularities of the align key pattern. The interference pattern is recognized in a detector, the direction and position of the semiconductor substrate are detected, and then the semiconductor substrate and equipment are adjusted in accordance with the detected direction and position of the semiconductor substrate, thereby performing alignment. However, in the STI, a device isolation oxide film is formed by etching back through using the CMP method or the like, thus providing a planar semiconductor substrate without any step between the device formation area and the device isolation area.

When an opaque film like a tungsten silicide, used as a gate electrode material, is formed on such a planar surface, an interference pattern due to reflection will not be formed. The alignment of the photolithographic equipment, therefore, is practically difficult to perform.

A method for forming align key patterns in a LOCOS and a STI structure using conventional technology will now be described in detail, referring to the attached drawings.

FIGS. 1A and 1B are plan views of the align key patterns in the LOCOS and STI structures using conventional technology. FIGS. 2A and 2B are vertical section views of the align key patterns of the LOCOS and STI structures using conventional technology.

FIG. 1A is a plan view of the align key pattern of the LOCOS structure. Reference numeral 12 denotes active regions and reference numeral 10 denotes field regions. As shown, in the field oxide film having a LOCOS structure, a distinct align key pattern is produced due to steps formed on the semiconductor substrate. As shown in FIG. 2A, which is a schematic cross-section of the LOCOS structure, steps of lower device isolation oxide films 20 formed on the surface of the semiconductor substrate are transcribed to an opaque film 22, e.g. a tungsten silicide which is formed on the whole surface of oxide films 20, and to a sensitized film 24, thereby forming a distinct align key pattern as shown in FIG. 1A.

FIG. 1B is a plan view of the align key pattern of the STI structure. Reference numeral 14 denotes active regions and reference numeral 16 denotes field regions. As shown in FIG. 2B, in the device isolation structure having a STI structure, no step is formed between the field region and the active region. Moreover, since an opaque material such as a tungsten silicide is formed on the whole surface of the semiconductor substrate having the STI structure, the steps on the lower layer cannot be sensed, thereby making a distinct formation of an align key pattern, required for photolithography, impossible.

FIG. 2A is a vertical cross-sectional view of the align key pattern of the LOCOS structure. On semiconductor substrate 18, is formed field oxide films 20 and then tungsten silicide 22. A photoresist 24 is covered on the whole surface of tungsten silicide 22. The LOCOS structure permits a distinct formation of an align key pattern due the steps formed by field oxide films 20. On the other hand, the LOCOS structure has a in that a bird's beak formed at the edge of the field oxide film contributes to the reduction in the area of an adjacent active region.

FIG. 2B is a vertical section view of the align key pattern of the STI structure. Trenches 26 are formed into semiconductor substrate 25, and then field oxide films 27 are formed on the whole surface of semiconductor substrate 25 thereby burying or filling trenches 26. Thereafter, the whole surface of the resultant substrate is etched back until the interface of an active region 28 is exposed, which results in the planarization of the whole surface of the substrate. On the whole surface of the planarized substrate, is formed tungsten silicide 29. A photoresist 30 is covered on the whole surface of tungsten silicide 29. Field oxide films 27 of the STI structure do not produce steps in relation to active region 28, and an opaque material like the tungsten silicide is formed on the whole surface of field oxide films 20, thereby making it difficult to obtain a distinct align key pattern, unlike in the LOCOS structure.

As described above, it is difficult to form an align key pattern on a semiconductor substrate of a STI structure by using the conventional align key pattern formation method, since no steps are created between the field region and the active region.

SUMMARY OF THE INVENTION

The object of the present invention is to provide a method for forming an align key pattern by producing a STI structure which has steps in its align key pattern area.

To achieve the above object, there is provided a method for forming an align key pattern in a semiconductor device according to the present invention, the method comprising the steps of:

forming a first insulating film pattern for defining field regions in a cell array area and an align key pattern area on a semiconductor substrate;

forming trenches in the field regions, using the first insulating film pattern as a mask;

forming a second insulating film on the whole surface of the semiconductor substrate, filling the trenches;

etching the second insulating film formed on the active regions of the cell array area and on the active and field regions of the align key pattern area, to a predetermined thickness;

etching back the whole surface of the semiconductor substrate;

forming a conductive layer on the whole surface of the semiconductor substrate; and covering a photoresist on the whole surface of the conductive layer.

The conductive layer is formed as a gate electrode by ion-implanting a conductive impurity into polysilicon or using tungsten silicide ($WSi_x$). The width of the trenches formed in the cell array area is smaller than that of the trenches formed in the align key pattern area.

The present invention facilitates the alignment of a semiconductor substrate with the processing equipment in a photolithographic process by forming an align key pattern, while utilizing the fabrication steps of a STI structure.

BRIEF DESCRIPTION OF THE DRAWINGS

The-above object and advantages of the present invention will become more apparent by describing in detail a preferred embodiment thereof with reference to the attached drawings in which.

DETAILED DESCRIPTION OF THE EMBODIMENT

An embodiment of the present invention will now be described in detail, referring to the attached drawings.

FIGS. 3A through 3F sequentially show the steps of a method for forming an align pattern according to the present invention.

Figure 1A:
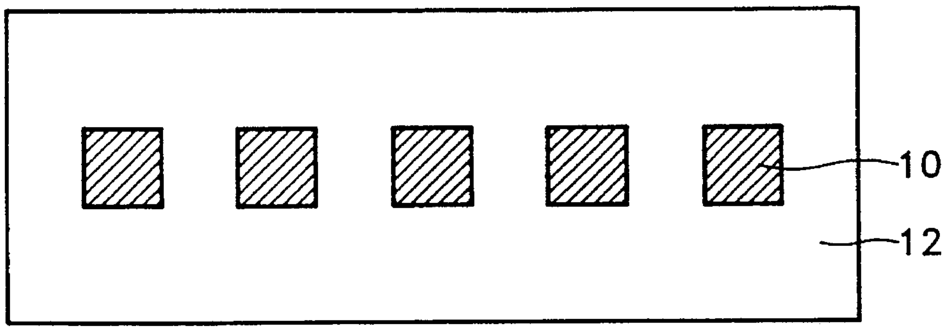
FIGS. 1A, 1B, 1C, 1D are plan views of align key patterns of a LOCOS and a STI structure using conventional technology.
Figure 1B:
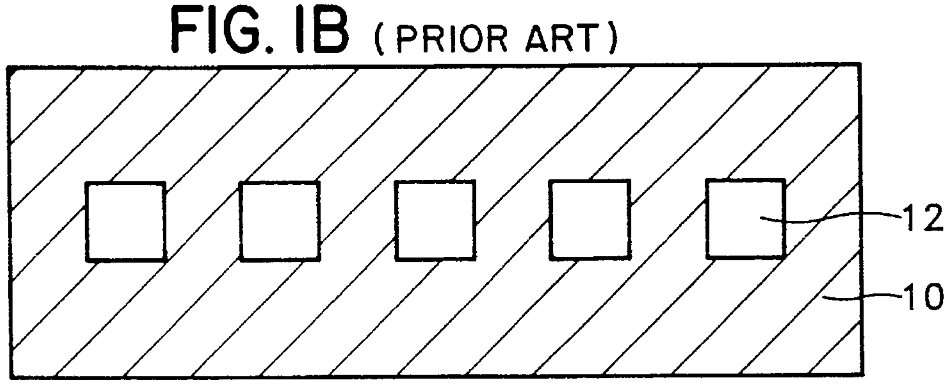
Figure 1C:
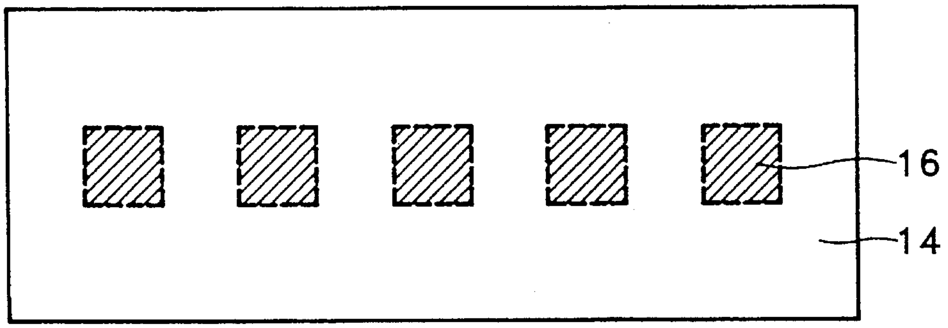
Figure 1D:
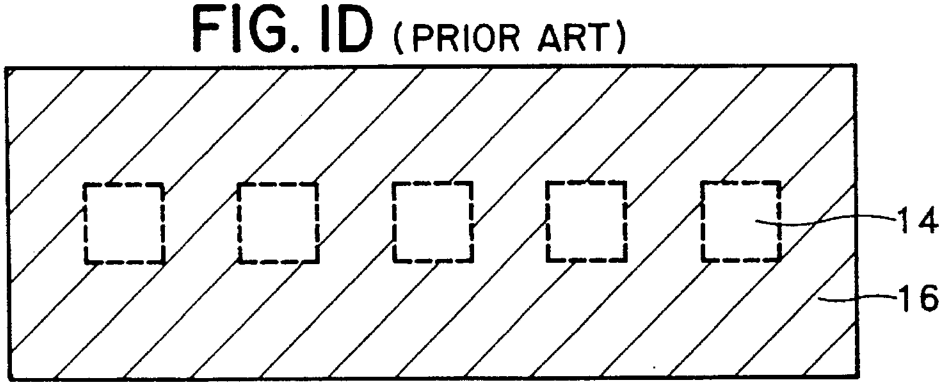
Figure 2A:
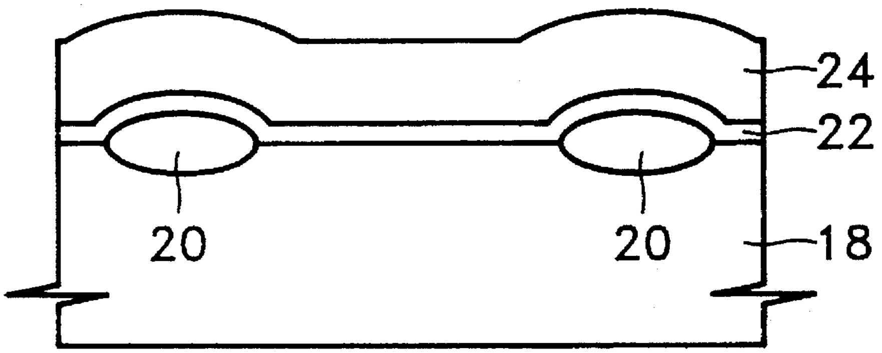
FIGS. 2A and 2B are vertical section views of the align key patterns of the LOCOS and STI structures using conventional technology.
Figure 2B:
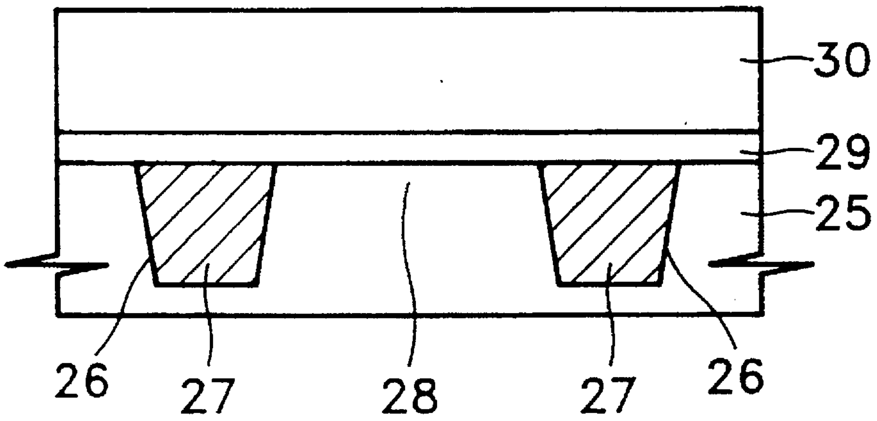
Figure 3A:
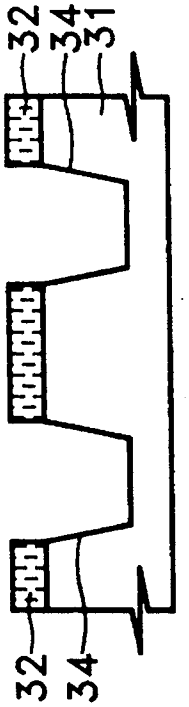
FIGS. 3A through 3L illustrate a method for forming an align pattern according to the present invention wherein an align key pattern in a cell array area and an align key pattern area are separately shown.

FIG. 3A illustrates the step of forming trenches 34 and 34*a*. A first insulating film pattern 32 is formed on semiconductor substrate 31 to define field regions. Then, trenches 34 and 34*a* are formed into the field regions to a predetermined thickness by anisotropically etching the whole surface of semiconductor substrate 31, using first insulating film pattern 32 as an etching mask. Needless to say, there is a difference in width between trench 34 formed into the cell array area and trench 34*a* formed into the align key pattern area. That is, the width of trenches 34 of the cell array area is smaller than that of trench 34*a* of the align key pattern area. First insulating film pattern 32 is generally formed of a nitride film (SiN) or a high temperature oxide film (HTO) to a thickness of 500Å–2,000Å. Additionally, trenches 34 are formed to have a depth of 0.2–0.5μm.

Figure 3B:
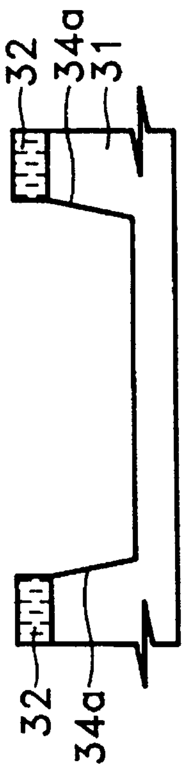

FIG. 3B shows the step of forming a second insulating film 36. Second insulating film 36 is formed on the whole surface of the resultant, substrate burying the trenches. Second insulating film 36 is formed as an oxide film to a thickness of 4,000–10,000Å. Trenches 34 formed in the cell array area are much narrower than trench 34*a* formed in the align key pattern area. Therefore, steps between an active region and a field region in the cell area are formed to be negligibly small. Accordingly, second insulating film 36 is formed, maintaining the shape of steps between the field region and the active region in the align key pattern area.

Figure 3C:
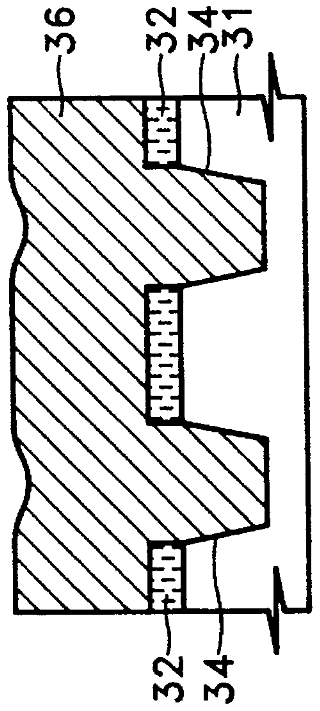

FIG. 3C shows the step of forming a photoresist pattern 38 for defining a field region in the cell array area. First, photoresist is covered on the whole surface of the resultant substrate. Thereafter, photoresist pattern 38 is formed for defining the field region in the cell array area and entirely exposing the field and active regions in the align key pattern area.

Figure 3D:
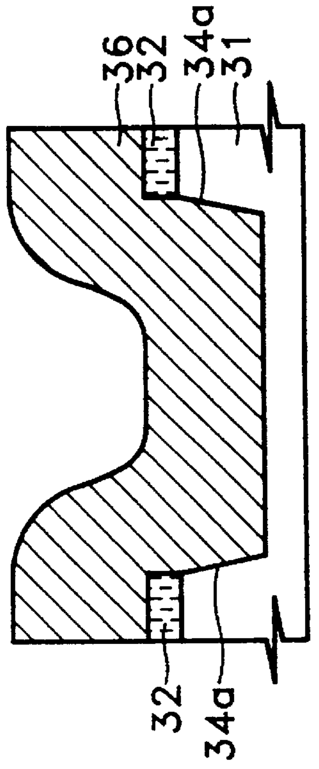

FIG. 3D shows the step of forming a second insulating film pattern 36*a*. The whole surface of the resultant substrate is anisotropically etched to a predetermined depth, using photoresist pattern 38, shown in FIG. 3C, as an etching mask. Thus, in the cell array area, a second insulating film pattern 36*a* is formed by removing the areas corresponding to the active regions of second insulating film 36 (shown in FIG. 3C). In this step, trench 34*a* of the key pattern formation area is as deep as trenches 34 of the cell array area, but the former is wider than the latter. Further, the align key pattern area is not protected. Consequently, the anisotropic etching is performed on the whole surface of the align key pattern area, to the vicinity of the whole surface of trench 34*a*. Photoresist pattern 38 is usually formed by modifying a portion of a sensitized film pattern used for the suppression of dishing which occurs in a subsequent CMP process. There is, however, no addition to the steps of the process.

Figure 3E:
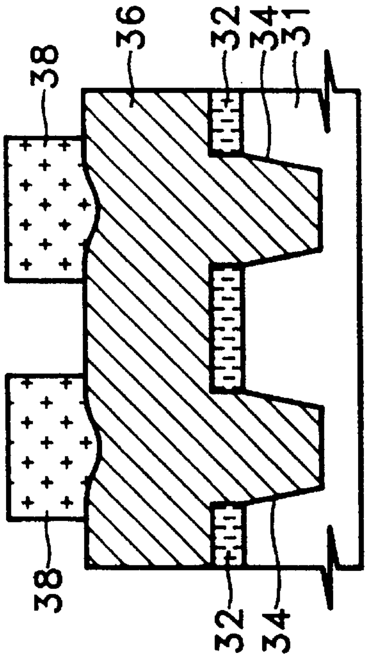

FIG. 3E shows the step of etching back second insulating film pattern 36*a* shown in FIG. 3D. Photoresist pattern 38 formed on the cell array area is removed from the resultant substrate. The whole surface of the resultant substrate is etched back by a CMP method. In the cell array area, the CMP process planarizes the surface of filled trenches 34, thereby forming a new second insulating film pattern 36*b*. In the align key pattern area, second insulating film pattern 36*a* is removed from the active region by the CMP process, and new second insulating film pattern 36*b* is formed only on the surface of trench 34*a*.

Figure 3F:
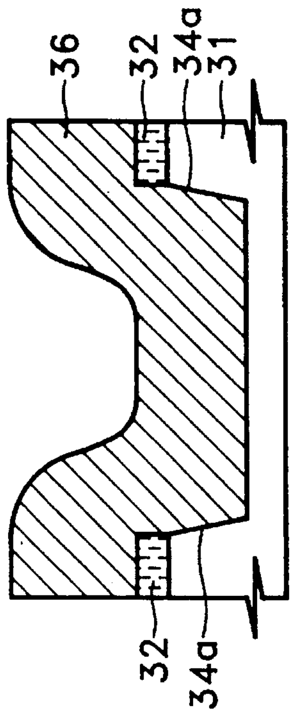
Figure 3G:
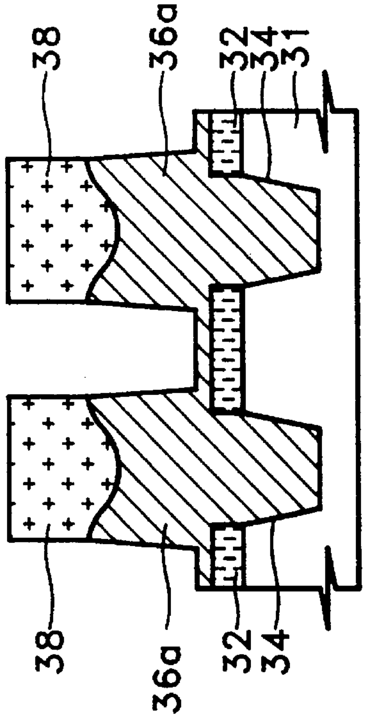
Figure 3H:
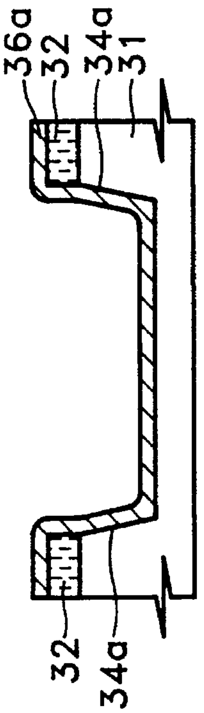
Figure 3I:
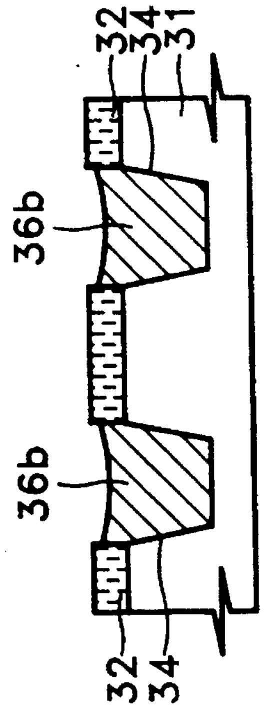
Figure 3J:
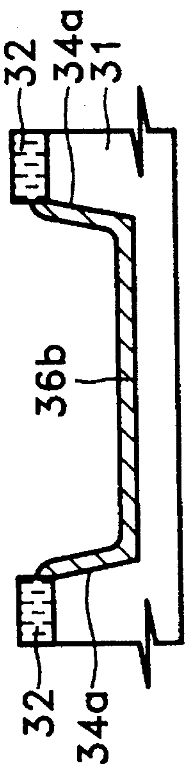
Figure 3K:
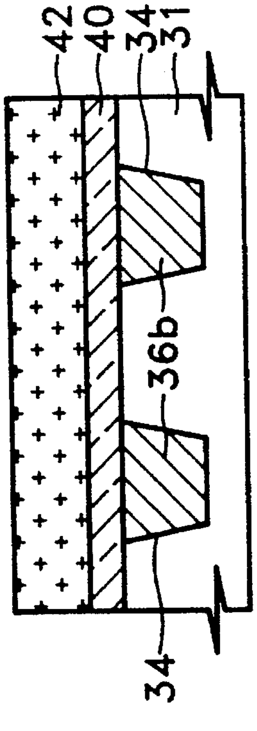
Figure 3L:
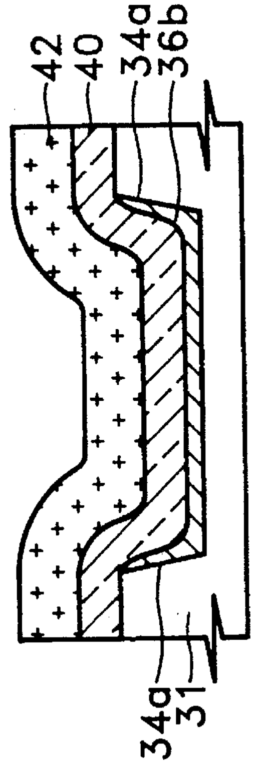

FIG. 3F shows the step of completing the align key pattern. First insulating film 32 is removed. Thereafter, conductive layer 40 is formed on the planarized surface of the semiconductor substrate and photoresist 42 is covered on the resultant substrate. In this process step, no steps are formed due to the planarized surface in the cell array area, while in the align key pattern area having relatively wide trench 34*a*, steps between trench 34*a* and the active regions are created. Thus, the align key pattern can be produced, utilizing the steps formed in the align key pattern area. After a polysilicon film is formed on the whole surface of the semiconductor substrate, conductive layer 40 is formed by ion-implanting a conductive impurity into the resultant substrate. Another way to form conductive layer 40 is to use tungsten silicide ($WSi_x$). Namely, either doped polysilicon or tungsten silicide is used for conductive layer 40.

As described above, the present invention exhibits the advantage that steps can be formed in a desired area for forming an align key pattern thereon in a semiconductor device adopting a STI structure, and thus the align key pattern needed for a photolithographic process is obtainable.

The present invention is not restricted to the above embodiment, and it is clearly understood that many variations may be made within the scope and spirit of the present invention by anyone skilled in the art.

What is claimed is:

1. A method for forming an align key pattern in a semiconductor device, the method comprising the steps of:

forming a first insulating film pattern for defining field regions in a cell array area and an align key pattern area on a semiconductor substrate;

forming trenches in said field regions, using said first insulating film pattern as a mask;

forming a second insulating film on the whole surface of said semiconductor substrate, while filling said trenches;

etching said second insulating film formed on the active regions of said cell array area and on the active and field regions of said align key pattern area, to a predetermined thickness;

etching back the whole surface of said semiconductor substrate;

forming a conductive layer on the whole surface of said semiconductor substrate; and covering a photoresist on the whole surface of said conductive layer.

2. A method for forming an align key pattern in a semiconductor device as claimed in claim 1, wherein said second insulating film is formed of an oxide film.

3. A method for forming an align key pattern in a semiconductor device as claimed in claim 1, wherein said conductive layer is formed of one of a doped polysilicon and a tungsten silicide.

4. A method for forming an align key pattern in a semiconductor device as claimed in claim 1, wherein said second insulating film is etched to a predetermined thickness by using a photoresist pattern for exposing the active regions of said cell array area and the whole surface of said align key pattern area.

* * * * *